United States Patent
Verbrugge et al.

(10) Patent No.: US 10,417,378 B2
(45) Date of Patent: *Sep. 17, 2019

(54) METHOD FOR MODELING A NON-STREAMLINED PROPELLER BLADE

(71) Applicant: SNECMA, Paris (FR)

(72) Inventors: Cyril Verbrugge, Moissy-Cramayel (FR); Jonathan Vlastuin, Moissy-Cramayel (FR); Clement Dejeu, Moissy-Cramayel (FR); Anthony Louet, Moissy-Cramayel (FR)

(73) Assignee: SAFRAN AIRCRAFT ENGINES, Paris (FR)

( * ) Notice: Subject to any disclaimer, the term of this patent is extended or adjusted under 35 U.S.C. 154(b) by 355 days.

This patent is subject to a terminal disclaimer.

(21) Appl. No.: 14/908,399

(22) PCT Filed: Jul. 28, 2014

(86) PCT No.: PCT/FR2014/051953
§ 371 (c)(1),
(2) Date: Jan. 28, 2016

(87) PCT Pub. No.: WO2015/015107
PCT Pub. Date: Feb. 5, 2015

(65) Prior Publication Data
US 2016/0162629 A1 Jun. 9, 2016

(30) Foreign Application Priority Data

Jul. 29, 2013 (FR) .................................... 13 57449

(51) Int. Cl.
*G06F 17/50* (2006.01)
*F01D 5/14* (2006.01)
(Continued)

(52) U.S. Cl.
CPC .......... *G06F 17/5095* (2013.01); *B64C 11/18* (2013.01); *F01D 5/141* (2013.01);
(Continued)

(58) Field of Classification Search
CPC . B64C 11/18; G06F 17/5095; G06F 17/5009; F01D 5/141; F04D 27/001; F04D 29/324
See application file for complete search history.

(56) References Cited

U.S. PATENT DOCUMENTS

2012/0283994 A1* 11/2012 Duong ................. F01D 5/3007
703/1

OTHER PUBLICATIONS

Maesschalck et al. ("Blade Tip Shape Optimization for Enhanced Turbine Aerothermal Performance". ASME. Turbo Expo: Power for Land, Sea, and Air, vol. 3C: Heat Transfer ():V03CT14A011. Jun. 2013) (Year: 2013).*

(Continued)

*Primary Examiner* — Omar F Fernandez Rivas
*Assistant Examiner* — Joshua E. Jensen
(74) *Attorney, Agent, or Firm* — Womble Bond Dickinson (US) LLP (57) ABSTRACT

A method for modeling at least a part of a blade of a non-streamlined propeller, part of the blade having an offset. The method includes (a) Parameterization of at least one Bezier curve representing a deformation of the blade characterizing the offset, defined by: a. First and second end control points (PCU1, PCUK); b. At least one intermediate control point (PCUi, i∈[[2,K−1]]) disposed between the end points (PCU1, PCUK). The parameterization being performed according to at least one deformation parameter and the cutting height in the blade, on the basis of which the abscissa of the intermediate control point (PCUi) and the ordinate of the second end point (PCUK) are expressed. Optimized values of the deformation parameter or parameters are determined and then output.

13 Claims, 6 Drawing Sheets

(51) Int. Cl.
*B64C 11/18* (2006.01)
*F04D 27/00* (2006.01)
*F04D 29/32* (2006.01)
*B64D 27/00* (2006.01)

(52) U.S. Cl.
CPC ......... *F04D 27/001* (2013.01); *F04D 29/324* (2013.01); *B64D 2027/005* (2013.01); *F05D 2220/36* (2013.01); *F05D 2260/81* (2013.01); *Y02T 50/66* (2013.01); *Y02T 50/673* (2013.01)

(56) References Cited

OTHER PUBLICATIONS

Fowler, Barry, and Richard Bartels. "Constraint-based curve manipulation." IEEE Computer Graphics and Applications 13.5 (1993): 43-49. (Year: 1993).*

Lepot, Ingrid, et al. "Aero-mechanical optimization of a contra-rotating open rotor and assessment of its aerodynamic and acoustic characteristics." Proceedings of the Institution of Mechanical Engineers, Part A: Journal of Power and Energy 225.7 (2011): 850-863. (Year: 2011).*

International Search Report and Written Opinion in PCT/FR2014/0519543 dated Jan. 26, 2016, with English translation. 20 pages.

Search Report in French Application No. 1357449 dated May 13, 2014, with English translation coversheet. 3 pages.

Marinus et al. "Aerodynamic Study of a 'Humpy' propeller," Int. Journal of Engineering Systems Modelling and Simulation, vol. 4 No. 1/2, 2012, pp. 27-35.

Marinus. "Influence of parameterization and optimization method on the optimum airfoil." 27th Congress of Int. Councel of the Aeronautical Sciences—ICAS, Sep. 24, 2010.

Marinus et al. "Aeroacoustic and Aerodynamic Optimization of Aircraft Propeller Blades." 16th AIAA/CEAS Aeroacoustics conference, Stockholm, Sweden, Jun. 8, 2010.

Read et al. "Effect of a Winglet on Open Rotor Aerodynamics and Tip Vortex Interaction." 49th AAIA/ASME/SAE/ASEE Joint Propolsion conference Jul. 15-17, 2013. San Jose, CA, Amer. Institute of Aeronautics and Astronautics vol. 1, Jul. 17, 2013.

* cited by examiner

METHOD FOR MODELING A NON-STREAMLINED PROPELLER BLADE

GENERAL TECHNICAL FIELD

The present invention relates to computer-aided design.
More specifically, it relates to a method for modeling a propeller blade.

STATE OF THE ART

Engines with "non-streamlined" fans (or turboprops of the "Propfan" or "Open rotor" type) are a type of turbine engine for which the fan is attached outside the case, unlike conventional turbine engines (of the "Turbofan" type) in which the fan is streamlined.

Figure 1:
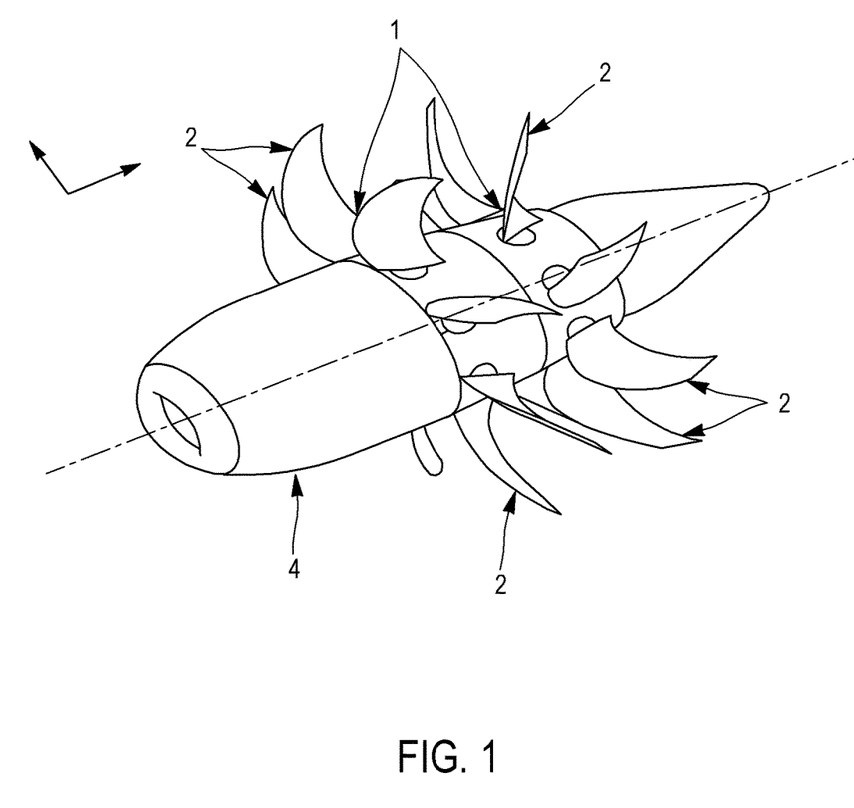
FIG. 1, described earlier, represents an example of a contra-rotary open rotor on vanes of which the method according to the invention is applied.

The "Contra-Rotating Open Rotor" (CROR) illustrated in FIG. 1 is notably known, which is equipped with two propellers rotating in opposite directions. It is of a great interest because of its particularly high propelling yield.

The object of this type of engine is thus to retain the speed and the performances of a turbine engine by keeping fuel consumption similar to that of a turboprop. By the fact that the fan is no longer streamlined, it is actually possible to increase the diameter and the useful air flow for the thrust.

However, the absence of streamlining causes problems for observing specifications, notably in terms of acoustics since this type of engine generates more noise than a conventional engine. Indeed, the production of traction on each propeller blade rests on the presence of a circulation distribution over the extent of the propellers. And this circulation naturally escapes at the blade head (instead of being channeled by the case), generating a so-called "marginal" vortex.

The interaction of this upstream blade head marginal vortex over the rotating surfaces of the downstream propeller poses a real challenge in terms of acoustics, insofar that the strong generated noise is not blocked by any case.

Present standards impose maximum noise thresholds in areas close to the ground, i.e. during takeoff and approach, which present geometries do not give the possibility to attain.

It will be desirable to improve these geometries, in particular at the blade heads, so as to reduce the generated noise without significantly impacting either the efficiency of the engine, or its consumption.

Many computer tools for modeling blades and other aeronautical parts are known for this, which give the possibility of assisting with the design of these parts by automatically optimizing some of their characteristics. The principle is to determine an aeromechanical geometrical optimum of the laws of the blade, in other words of one or several curves describing the value of a physical quantity (such as the yield, the pressure rise, the flow rate capacity or the margin upon pumping) along a section or a height of the blade, in a given environment, by executing a large number of simulation calculations.

However, the same methods are used today for designing streamlined fans as for non-streamlined propellers, i.e. modeling of 2D profiles which are subsequently wound over current lines (while observing the angles of the profile) and stacked according to a selected and optimizing stacking law.

Such solutions prove to be adapted for many physical quantities of non streamlined propellers, but it remains very difficult to obtain a substantial improvement in noise levels.

Alternatively, it would be possible to use mesh deformation algorithms. Such methods remain contemplated since they provide a lot of advantages in terms of surface cleanliness and ease in design. However up to now they require a lot of development work before being able to be used in industrial design.

It would then be desirable to find an innovating method for modeling a non-streamlined propeller which allows substantial improvement of their aero-acoustic performances while being economical in terms of the use of computer resources.

PRESENTATION OF THE INVENTION

The present invention according to a first aspect proposes a method for modeling at least one portion of a blade of a non-streamlined propeller, the blade portion having an offset, the method being characterized in that it comprises the implementation, by data processing means of a piece of equipment, steps of:
(a) parameterization of at least one Bezier curve representing a deformation of said blade characterizing the offset, depending on a position along a section at a given height in the blade, the curve being defined by:
   a. a first and second end control point defining the extent of said section of the blade;
   b. at least one intermediate control point positioned between the end points,
   the parameterization being performed according to at least one deformation parameter and said height of the section in the blade, dependent on which the abscissa of the intermediate control point and the ordinate of the second end point are expressed;
(b) determination of optimized values of the deformation parameter(s);
(c) outputting to an interface of said piece of equipment the thereby determined values.

According to other advantageous and nonlimiting features:
the deformation parameters are a relative height of the beginning of the deformation $h_0$ and a maximum offset $d_{max}$ at the end of the blade, the at least one parameterized Bezier curve being associated with a relative sectional height h in the blade, $h \in [h_0, 1]$;
the ordinate $y_K$ of the second end control point is given by $$y_K = d_{max} * \left(\frac{h - h_0}{1 - h_0}\right)^2;$$

the abscissa $x_i$ of at least one intermediate control point is proportional to $$x_{rel} = 1 - \left(\frac{h - h_0}{1 - h_0}\right)^2;$$

$K \geq 4$, the or $i^{th}$ intermediate control points, $i \in [[2, K-2]]$ being movable points for which the abscissa depends on the height of said section in the blade, the $K-2^{th}$ intermediate control point being fixed;
the abscissa $x_i$ of the K-3 movable intermediate control points is given by $$x_{i \in [[2, K-2]]} = x_{K-1} * \frac{i - 1}{K - 3} * x_{rel}$$

with $x_{K-1}$ being the abscissa of the fixed intermediate control point ($PCU_{K-1}$);

$x_{K-1}=0.75$;

K=7, so as to have 4 movable intermediate control points;

the ordinate of the first end control point and of each intermediate control point is equal to zero;

the derivative of the Bezier curve at the first end control point is zero;

a plurality of Bezier curves corresponding to sections at various heights in the blade is parameterized in step (a);

the optimized values determined in step (b) are the values of deformation parameters for which the intensity of a marginal vortex generated by the blade is a minimum.

According to a second and then a third aspect, the invention relates to a method for manufacturing a blade of a non-streamlined propeller, the blade having an offset, the method comprising the steps of:

performing the method according to the first aspect so as to model at least one portion of the blade;

manufacturing said blade according to the modeling of the at least one portion of the obtained blade;

as well as a non-streamlined propeller comprising a plurality of blades obtained via the method according to the second aspect.

According to a fourth aspect, the invention relates to a piece of modeling equipment of at least one portion of a blade of a non-streamlined propeller, the blade portion having an offset, characterized in that it comprises data processing means configured for implementing:

a module for parameterizing at least one Bezier curve representing a deformation of said blade characterizing the offset, depending on a position along a section at a given height in the blade, the module defining the curve by:

a. a first and second end control point defining the extent of said section of the blade;

b. at least one intermediate control point positioned between the end points, the parameterization being performed according to at least one deformation parameter and said height of the section in the blade, depending on which the abscissa of the intermediate control point and the ordinate of the second end point are expressed;

a module for determining optimized values of the deformation parameter(s);

a module for outputting the determined values to an interface of said piece of equipment.

According to a fifth and sixth aspect, the invention respectively relates to a computer program product comprising code instructions for executing a method according to the first aspect of the invention for modeling at least one portion of a blade of a non-streamlined propeller; and a storage means legible by a piece of computer equipment on which a computer program product comprises code instructions for executing a method according to the first aspect of the invention for modeling at least one portion of a blade of a non-streamlined propeller.

PRESENTATION OF THE FIGURES

Other features and advantages of the present invention will become apparent upon reading the description which follows of a preferential embodiment. This description will be given with reference to the appended drawings wherein.

DETAILED DESCRIPTION

Blade Offset

In FIG. 1, the illustrated open-rotor comprises a turbine 4, and two non streamlined propellers 1. These propellers 1 in this example are counter-rotating. Each propeller 1 has a plurality of blades 2 extending radially from the case of the rotor.

Figure 2A:
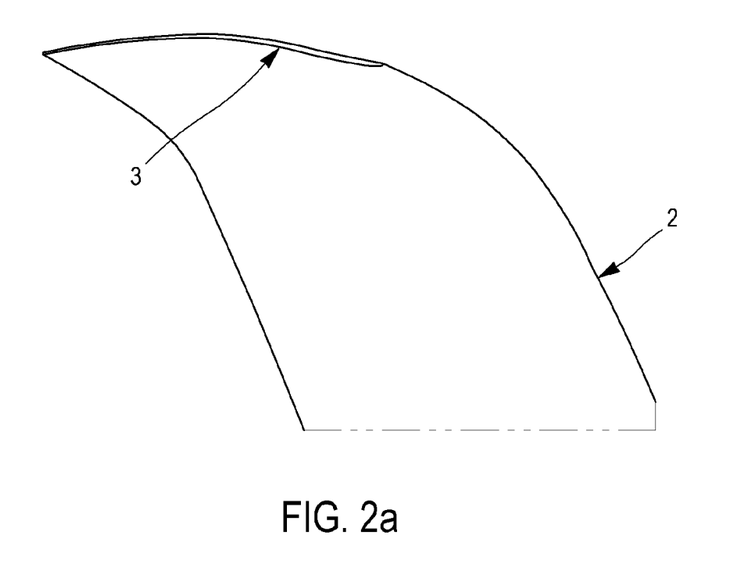
FIGS. 2a-2b are two views of the end of a blade of a non-streamlined propeller of such a rotor.
Figure 2B:
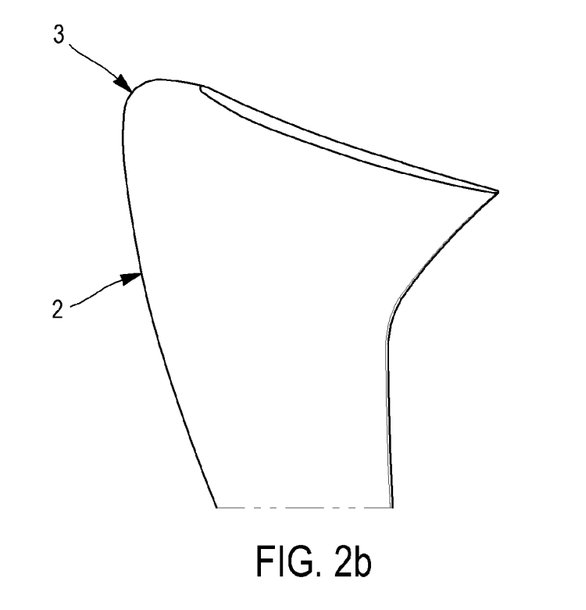

FIGS. 2a and 2b illustrate a detail of the head of a blade 2. This head is equipped with an offset 3, in other words a system of the so-called "winglet" type. This is a strong curvature, which sometimes assumes as far as the shape of an orthogonal winglet (case of winglets at the end of a wing). The benefit of such a system is to design at the blade head 2, discharged (Cz=0) or even negatively charged profiles or by reversing the wing upper surface and the wing lower surface.

By means of such an offset 3, better dissipation of the marginal vortices generated at the blade end 2 may be expected. However, up to now it has not been possible to obtain a blade head geometry 2 which sufficiently manages to reduce the noise disturbances.

The present method is designed for the specific modeling of at least one portion of a blade 2 (in particular its head) of a non-streamlined propeller 1, the blade portion 2 having a tangential offset 3. For this, the idea is to define the offset 3 as a deformation of the "backbone" of the blade 2 with respect to a reference plane, this advantageously from certain highly specific parameters which will be described later on.

Figure 4:
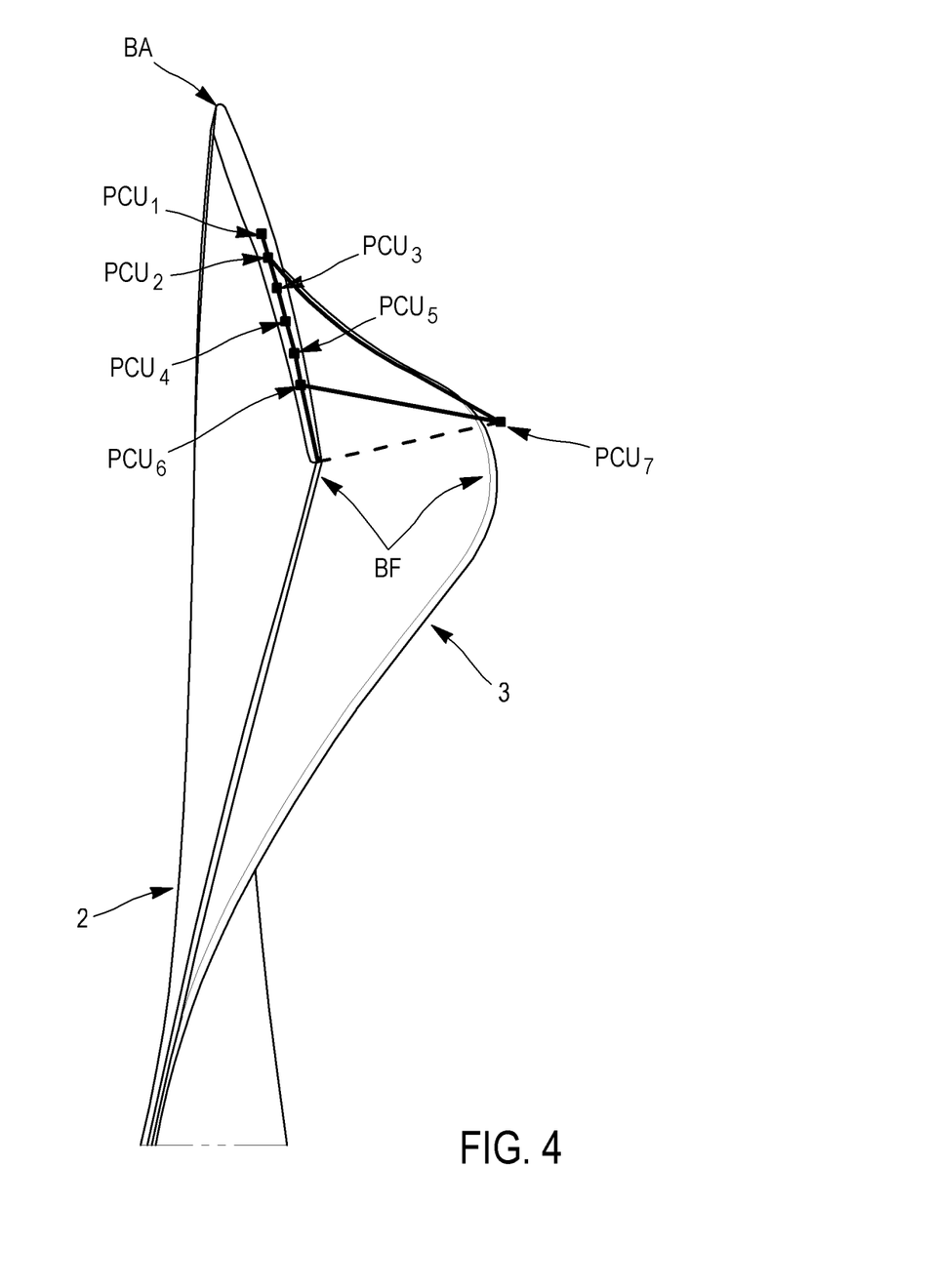
FIG. 4 illustrates the application of the method on a blade of a non streamlined propeller.

The backbone is, in a section (i.e. a cross-section) of the blade 2, a median line which extends from one leading edge BA towards a trailing edge TE. FIG. 4 illustrates a same blade 2 in two configurations: an initial one (i.e. without any offset 3, the backbone assuming the shape of a straight line) and a deformed one (i.e. with a displacement of the trailing edge so as to give a curved shape to the backbone characterizing the offset 3). This FIG. 4 will be described in more detail later on. The backbone should not be confused with the chord, which also connects the leading and trailing edges in a section, but by passing through the envelope of the blade 2.

The "height" of the blade 2 is found orthogonally to a section, i.e. at the position along a longitudinal axis. Each section of the blade 2 is at a given height in the blade 2.

Figure 3:
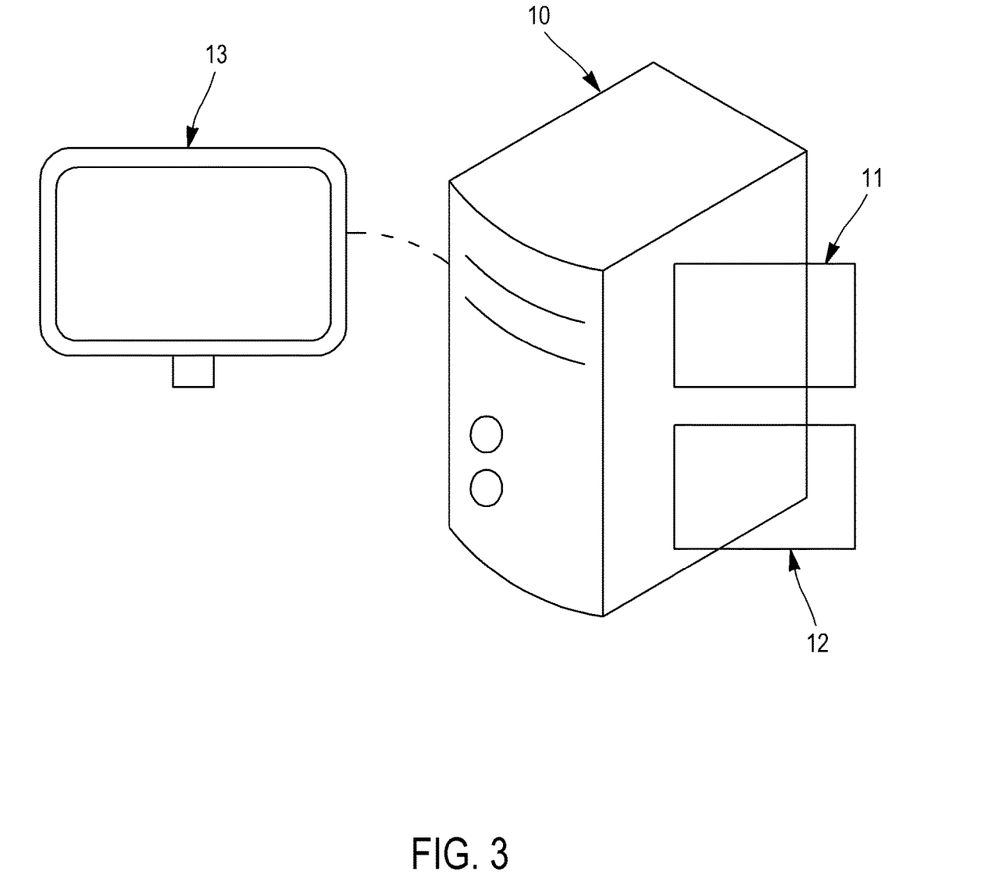
FIG. 3 represents a system for implementing the method according to the invention.

The blade portion 2 is modeled, during its design, via a piece of computer equipment 10 of the type of the one illustrated in FIG. 3. It comprises data processing means 11 (one or several processors), data storage means 12 (for example one or several hard discs), interface means 13 (consisting of input means such as a keyboard and a mouse or a tactile interface, and of output means such as a screen for displaying results). Advantageously, the piece of equipment 10 is a supercomputer, but it will be understood that an implementation on various platforms is quite possible.

Even if the dissipation of the vortices is the main criterion selected to be optimized during modeling of the blade, it will be understood that other criteria may be selected. As an example, one may attempt to maximize the mechanical properties such as the resistance to mechanical stresses, the frequency responses of the vane, the displacements of the blade, aerodynamic properties such as the yield, the rise in pressure, the flow rate capacity or the margin upon pumping, etc.

Parameterization

It is necessary to parameterize the backbone deformation law which is sought to be optimized, i.e. by making it a function of N input parameters. The optimization then consists of varying (generally randomly) these various parameters under stress, until their optimum values are determined for the predetermined criterion of dissipation of the vortices. A "smoothed" curve is then obtained by interpolation from determined passage points.

The number of required computations is then directly related (either linearly or even exponentially) to the number of input parameters of the problem.

Many methods for parameterization of a law exist, and in particular it is possible to distinguish two large categories:
  a discrete model: the law is defined by the position of a plurality of points (in practice 5 to 10 for a law over the height, and from 50 to 200 for a section), moved one by one during the optimization;
  a parametric model: the law is defined via mathematical curves known in the literature, such as Bezier curves or Non-Uniform Rational B Spline curves (NURBS).

It is desirable to use a large number of parameters for improving by as much the quality of a law (this is a major challenge for blade designs), but such an approach is rapidly limited by the capacity and the resources of present processors.

Even by using expensive supercomputers, the time required for modeling a single law is consequent.

Another problem, it is seen that in the presence of a large number of parameters, problems appear: the determined laws actually have a too large number of passage points to be observed, and the first obtained curves are abnormally "undulated" (this is what is called the Runge phenomenon) and unusable as such. They have to be re-worked until they are sufficiently smooth, which further increases the time required for obtaining the results.

As this will be seen, the present method allows an excellent modeling quality of a blade head 2 which gives the possibility with an surprisingly reduced number of parameters of obtaining substantial improvement in the dissipation of the marginal vortices (and therefore of the noise level).

In a step (a), performed by the data processing means 11 under the control of an operator, a curve is parameterized illustrating the value of a deformation of the blade 2 (characterizing the offset 3 as explained) depending on a position along a section of the blade 2 of the non-streamlined propeller 1, at a given height in the blade 2. By "section", is also meant "section portion", i.e. any or a portion of the space extending from the leading edge BA to the trailing edge TE.

The position along the curve is preferably expressed as a function of the backbone length (in abscissas), and more specifically the "normalized" backbone length, i.e. expressed between 0 and 1 when one crosses the blade 2 from one edge to another. This corresponds in other words to the coordinate x which a point of the backbone would have in an orthonormal reference system in which the point BA would have (0,0) as coordinates, and the point BF have (1,0). For example, a point of the section associated with a normalized backbone length of "0.5" is on the perpendicular bisector of the backbone. It is noted that as the curve may extend over only one portion (continuous) of the section of the blade 2, the associated function is defined on a subinterval from [0, 1].

However it will be understood that the invention is by no means limited to the expression of a curve representing the value of a deformation versus a backbone length, and that other reference systems are possible (for example a cord length).

This curve representing the value of a deformation should be understood as the modeling of the deformation law.

This is a Bezier curve. The latter are parametric polynomial curves defined as combinations of N+1 elementary polynomials, so called Bernstein Polynomials: a Bezier curve is defined by the set of points $\Sigma_{i=0}^{N} B_i^{N}(t) \cdot P_i$, $t \in [0,1]$, the $$B_i^N(t) = \binom{N}{i} t^N (1-t)^{N-i}$$

being the N+1 Bernstein polynomials of degree N.

The points $\{P_0, P_1 \ldots P_N\}$ are called "implicit" control points of the curve and form the variables by means of which a law of a blade may be modeled by a Bezier curve.

These points are called "implicit" since a Bezier curve may be considered as the set of the barycenters of N+1 weighted control points with a weight equal to the value of the Bernstein polynomial associated with each control point. In other words, these points act as localized weights generating attracting the curve without it passing therethrough (except for the first and the last, respectively corresponding to t=0 and t=1, and certain cases of alignment of points).

Generally, in the known modeling techniques of a law using a Bezier curve, the end control points $P_0$ and $P_N$ of the curve used are set (they define the extent of the portion of a part on which the modeling will be applied), but the other points $\{P_1 \ldots P_{N-1}\}$ have movable coordinates forming the input parameters for the optimization algorithm.

In the present method, like in the prior art, the curve is defined by means of its K control points, K≥3. Two end user control points $PCU_1$ and $PCU_K$ (i=1 and i=K) define the extent of the portion of the part (i.e. the field of definition of the curve). The Bezier curve further uses at least one intermediate user control point $PCU_i$, $i \in [[2, K-1]]$ positioned between both of these end points $PCU_1$ and $PCU_K$.

However, the second end point $PCU_K$ is here the main movable point. In particular, the abscissa of at least one intermediate control point $PCU_i$ (or even, as this will be seen later on, all except one) and the ordinate of the second end point $PCU_K$ depend on said height of the section in the blade 2 and on at least one deformation parameter. In other words, the parameterization is performed according to this deformation parameter and to the height of the section in the blade 2.

The idea is to modify the backbone at the blade head 2 in a coordinated way over a plurality of sections (the deformation "propagates") continuously depending on their height in the blade 2, and the deformation parameter(s). In other words, a plurality of Bezier curves corresponding to sections at different heights in the blade 2 is parameterized in step (a).

Deformation Parameters and User Control Points

Preferably, the deformation parameters are two in number:
- a relative height of the onset of deformation $h_0$; and
- a maximum offset $d_{max}$ at the end of the blade 2, $h_0$ is a relative height, i.e. "normalized", in other words expressed between 0 and 1 when passing through the blade 2 from the base (junction with the disc of the propeller 1) to the end of the head. This is a deformation onset height, i.e. the offset 3 exists in the interval $[h_0, 1]$. Each parameterized Bezier curve is thus associated with a relative sectional height h in the blade 2, $h \in [h_0, 1]$ (since for $h \in [0, h_0]$ there is no deformation).

The maximum offset corresponds to the maximum value of the deformation on the whole of the offset 3, attained at the end of the blade 2 at the trailing edge BF (as this is seen in FIG. 4, the latter moves).

Both of these deformation parameters allow by themselves the parameterization (with the height h) of all the user control points defining a Bezier modeling curve.

For this, a coefficient $$\left(\frac{h-h_0}{1-h_0}\right)^2$$

is used which quadratically varies between 0 and 1 when h covers the interval $[h_0, 1]$.

The ordinate $y_K$ of the second end control point $PCU_K$ is given by $$y_K = d_{max} * \left(\frac{h-h_0}{1-h_0}\right)^2.$$

The abscissa $x_i$ of the intermediate control point(s) $PCU_i$ is as for it proportional to $$x_{rel} = 1 - \left(\frac{h-h_0}{1-h_0}\right)^2.$$

This intermediate control point $PCU_i$ is a "movable" point in so far that its coordinates depend on the height of the section. If $K \geq 4$ (at least 4 control points including two intermediate ones), it is possible to provide a "set" intermediate control point, the K-2$^{th}$ intermediate control point $PCU_{K-1}$ (the last but one control point).

The i$^{th}$ ($i \in [[2, K-2]]$) intermediate control point(s) $PCU_i$ is(are) therefore movable points for which the abscissa depends on the height of said section in the blade 2 (as explained proportionally to $$x_{rel} = 1 - \left(\frac{h-h_0}{1-h_0}\right)^2).$$

As this is seen in FIG. 4 introduced earlier, the ordinate $y_i$, $i \in [[1, K-1]]$ of the first end control point $PCU_1$ and of each intermediate control point $PCU_i$ is advantageously selected to be set and equal to zero. In other words, these first K-1 control points are aligned and on the initial backbone. Only the second end control point $PCU_K$ deviates from the latter.

And as explained earlier, the Bezier curve does not pass through the intermediate control points $PCU_i$. This alignment therefore does not generate any angle point for the Bezier curve but on the contrary controls the progressivity of its curvature. As an additional condition, the derivative of the Bezier curve is constraint to be zero at the first end control point $PCU_1$, since the first two control points have a same ordinate equal to zero.

The movable intermediate control points $PCU_i$, $i \in [[2, K-2]]$ as for them have variable abscissa such that they are closer to the first end control point $PCU_1$ when the height increases, in other words when the top of the blade 2 is approached. Thus, the more one moves upward in the blade 2, the more the weight of the intermediate control points is transferred to the leading edge LE, by widening by as much the curvature of the Bezier curve, and by increasing the portion of the backbone which is deformed (at the base of the offset 3, only a small area at the trailing edge BF is curved, while the offset 3 gains the whole blade width 2 at its top).

Insofar that the last intermediate control point $PCU_{K-1}$ is fixed, this allows independent control of the final camber of the offset. The abscissa of this point may therefore either be an additional parameter, or be set, for example, to $x_{K-1}=0.75$.

The abscissas of the movable intermediate control points are as for them defined so that the latter have regular spacings, and depending on the position of the set intermediate control point $PCU_{K-1}$.

In particular, when $h=h_0$ (base of the offset 3), the last movable intermediate control point coincides with the set intermediate control point, and when h=1 (end of the blade 2), $x_1=0$ and the whole of the movable intermediate control points have the abscissa 0 (they therefore coincide with the first end control point $PCU_1$).

As an example, it is possible to select abscissas $x_i$ of the K-3 movable intermediate control points $PCU_i$ given by $$x_{i \in [[2, K-2]]} = x_{K-1} * \frac{i-1}{K-3} * x_{rel}$$

with $x_{K-1}$ being the abscissa of the set fixed intermediate control point $PCU_{K-1}$ mentioned above.

Thus, in an optimum situation (illustrated by FIG. 4) with K=7, so as to have 4 movable intermediate control points (plus the set intermediate point and the two end points), the coordinates of the 7 points are:

$PCU_1$ (0; 0)

$PCU_2$ (0.75 * 1 * $x_{rel}$/4; 0)

$PCU_3$ (0.75 * 2 * $x_{rel}$/4; 0)

$PCU_4$ (0.75 * 3 * $x_{rel}$/4; 0)

$PCU_5$ (0.75 * 4 * $x_{rel}$/4; 0)

$PCU_6$ (0.75; 0)

$PCU_7$ $\left(1; d_{max} * \left(\frac{h-h_0}{1-h_0}\right)^2\right)$

Example

Figure 5:
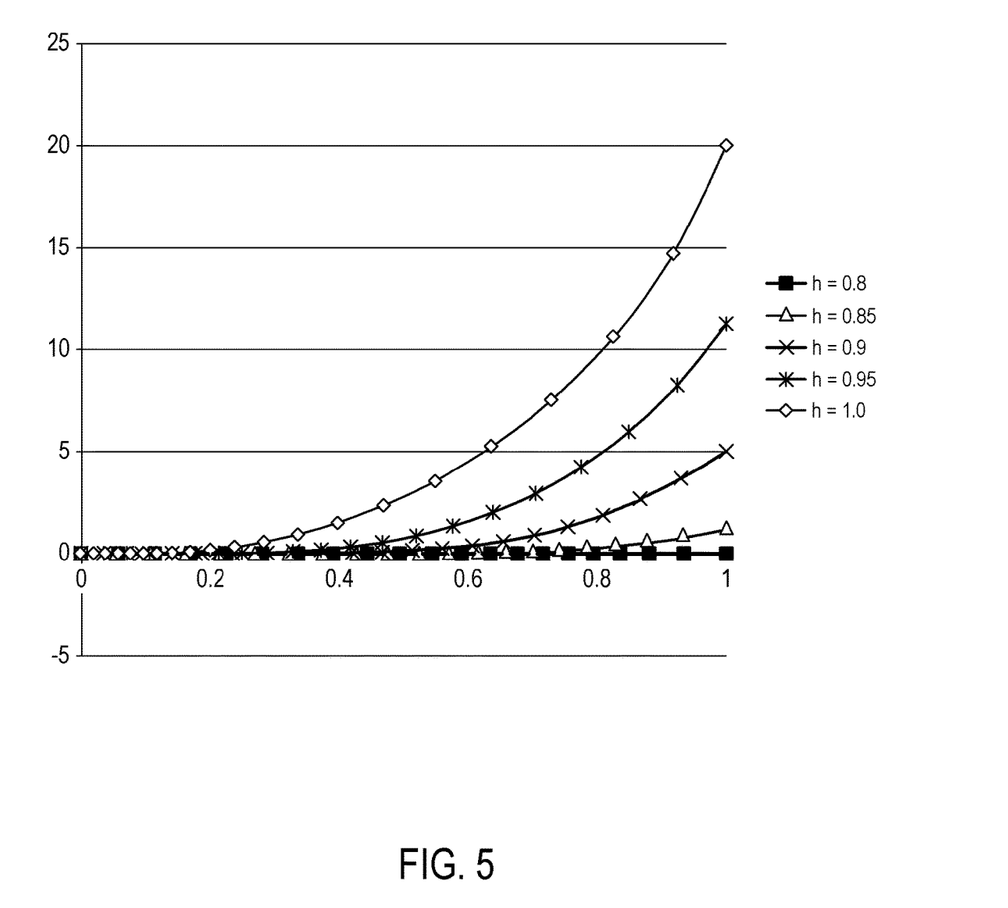
FIG. 5 is an exemplary graph illustrating deformation curves of the blade obtained by means of an embodiment of the method according to the invention.

FIG. 5 illustrates the Bezier curves obtained for 5 relative sectional heights comprised between 0.8 and 1. The deformation parameters associated with this parameterization are $h_0$=0.8 and $d_{max}$=20 mm.

It is noted that both the amplitude of the offset 3 and the deformed portion of the backbone gradually increase when the height increases.

Optimization and Output

According to a second step (b), the method comprises a step of determining by the data processing means 11 optimized values (and if possible optimum) of said at least one deformation parameter ($h_0$, $d_{max}$, as well as optionally other ones such as $x_{K-1}$). This is an optimization step.

Many techniques for implementing this step are known to one skilled in the art, and for example it will be simply possible to vary pseudo-randomly the variable selected parameters while carrying out simulations for determining these optimized values (i.e. for which the selected criterion, in particular the decrease of marginal vortices, is maximized) of the parameters of the control points $PCU_i$. The invention is however not limited to this possibility.

In a last step (c), the determined values of the parameter(s) are outputted to the interface means 13 of the piece of equipment 10 for use, for example by displaying the modeling curve in which the parameters are set to these optimized values.

Alternatively, the interface means 13 may only display these numerical values.

Tests

Tests were performed on thereby modeled blades 2, so as to check the possibility of being able, for a given blade to substantially increase the dissipation of the marginal vortices.

Figure 6A:
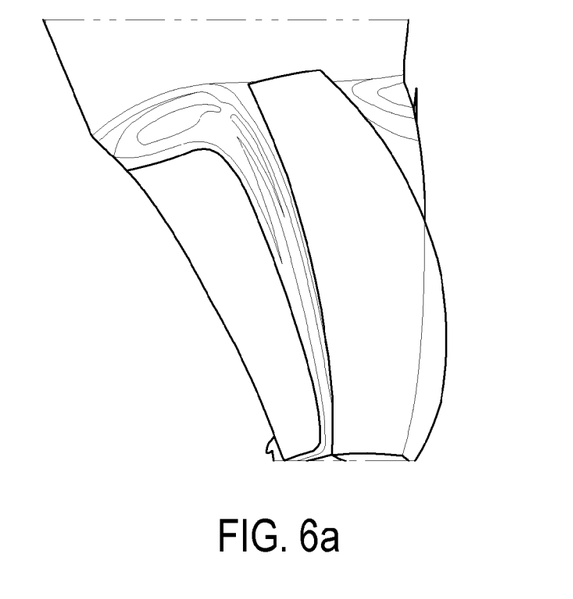
FIGS. 6a-6b give the possibility of comparing the aero-acoustic performances of a known blade and of a blade modeled by means of the method according to the invention.
Figure 6B:
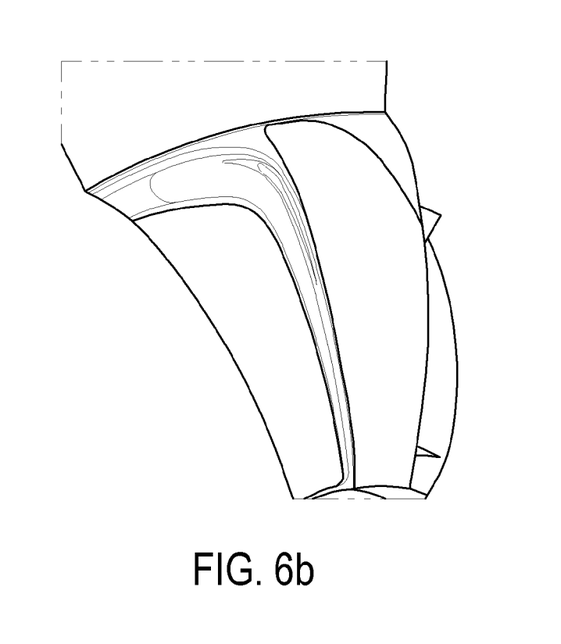

FIGS. 6a and 6b represent, for a conventional blade and for a blade 2 for which the offset 3 has been optimized by means of the present method, respectively, the vorticity (in other words the intensity of the marginal vortex) downstream from the non-streamlined propeller 1 upstream from the open-rotor of FIG. 1.

A reduction in the intensity of the order of 30% to 40% of the maximum vorticity is ascertained. It is also noted that initiation of the vortex is ensured at a slightly lower radius for the new blade 2.

The sole optimization of the tangential offset 3 therefore clearly shows a significant modification of the vortex physics at the head of the propeller blade, as well as at a high speed (modification of the trajectory, centrifugation), and at a low speed (significant reduction in the vortex intensity and shifted initiation in span).

Manufacturing Method and Propeller

Once its head has been modeled, the blade 2 may be manufactured. Thus a manufacturing method for a blade 2 of a non-streamlined propeller 1 is thus proposed, the blade 2 having an offset 3, the method comprising steps of:
  performing the method according to the first aspect so as to model at least one portion of the blade;
  manufacturing said blade 2 according to the modeling of the at least one portion of the obtained blade 2.

A non-streamlined propeller 1 comprising a plurality of blades 2, thereby produce, may be obtained. Each of its blades therefore has the offset 3 allowing improvement in the dissipation of marginal vortices, and thus reduction in the noise levels, without however decreasing its performances.

Equipment

The piece of equipment 10 (illustrated in FIG. 3) for implementing the method for modeling at least one portion of a blade 2 comprises data processing means 11 configured for implementing:
  a module for parameterization of at least one Bezier curve representing a deformation of said blade 2 characterizing the offset 3, depending on a position along a section at a given height in the blade 2, the module defining the curve with:
  a. first and second end control points $PCU_1$, $PCU_K$ defining the extent of said section of the blade 2;
  b. with at least one intermediate control point $PCU_i$, $i \in [[2, K-1]]$ positioned between the end points $PCU_i$, $PCU_K$,
  the parameterization being performed according to at least one deformation parameter and to said height of the section in the blade 2, as a function of which the abscissa of the intermediate control point $PCU_i$ and the ordinate of the second end point $PCU_K$ are expressed;
  a module for determining optimized values of said at least one deformation parameter;
  a module for outputting determined values to an interface 13 of said piece of equipment 10.

Computer Program Product

According to other aspects, the invention relates to a computer program product comprising code instructions for executing (on data processing means 11, in particular those of the piece of equipment 10) a method according to the first aspect of the invention for modeling at least one portion of a blade 2 of a non-streamlined propeller 1, as well as storage means legible by a piece of computer equipment (for example a memory 12 of this piece of equipment 10) on which this computer program product is found.

The invention claimed is:

1. A method for manufacturing a blade of a non-streamlined propeller, the method comprising:
  modeling said blade, using a data processor or a piece of equipment, at least one portion of the blade having a tangential offset along a direction orthogonal to a longitudinal axis of said blade, said modeling comprising:
  (a) parameterizing at least one Bezier curve representing a deformation of said blade characterizing the tangential offset, depending on a position along a section at a given height in the blade, the curve being defined by:
    a. A first and second end control point (PCU1, PCUK) defining the extent of said section of the blade;
    b. At least one intermediate control point (PCUi, i∈[[2, K-1]]) positioned between the end points (PCU1, PCUK),
    the parameterization being performed according to at least one deformation parameter and said height of the section in the blade, as a function of which the abscissa of the intermediate control point (PCUi) and the ordinate of the second end point (PCUK) are expressed;
  (b) determining optimized values of the deformation parameter(s);
  (c) outputting to an interface of said piece of equipment the thereby determined values;
  (d) manufacturing said blade according to the modeling of the at least one portion of the blade obtained by said modeling.

2. The method according to claim 1, wherein the deformation parameters are a relative height at the onset of deformation ($h_0$) and a maximum offset ($d_{max}$) at the end of the blade, the at least one parameterized Bezier curve being associated with a relative height h of a section in the blade, $h \in [h_0, 1]$.

3. The method according to claim 2, wherein the ordinate ($y_K$) of the second end control point ($PCU_K$) is given by $$y_K = d_{max} * \left(\frac{h - h_0}{1 - h_0}\right)^2.$$

4. The method according to claim 2, wherein the abscissa ($x_i$) of the at least one intermediate control point ($PCU_i$) is proportional to $$x_{rel} = 1 - \left(\frac{h - h_0}{1 - h_0}\right)^2.$$

5. The method according to claim 1, wherein K≥4, the $i^{ith}$ (i∈[[2, K−2]]) intermediate control points ($PCU_i$) being movable points for which the abscissa depends on the height of said section in the blade, the K−2$^{th}$ intermediate control point ($PCU_{K-1}$) being set.

6. The method according to claim 4, in which the abscissa ($x_i$) of the K−3 movable intermediate control points ($PCU_i$) is given by $$x_{i \in [[2, K-2]]} = x_{K-1} * \frac{i-1}{K-3} * x_{rel}$$

with ($x_{K-1}$) the abscissa of the set intermediate control point ($PCU_{K-1}$).

7. The method according to claim 6, wherein $x_{K-1}$=0.75.

8. The method according to claim 5, wherein K=7, so as to have four movable intermediate control points ($PCU_i$).

9. The method according to claim 1, wherein the ordinate of the first end control point ($PCU_1$) and of each intermediate control point ($PCU_i$) is equal to zero.

10. The method according to claim 9, wherein the derivative of the Bezier curve at the first end control point ($PCU_1$) is zero.

11. The method according to claim 1, wherein a plurality of Bezier curves corresponding to sections at different heights in the blade is parameterized in said step (a).

12. The method according to claim 1, wherein the optimized values determined in said step (b) are values of the deformation parameters for which the intensity of a marginal vortex generated by the blade is a minimum.

13. A non-streamlined propeller comprising a plurality of blades obtained via the method according to claim 1.

* * * * *